United States Patent [19]

Hsia

[11] Patent Number: 5,061,987
[45] Date of Patent: Oct. 29, 1991

[54] SILICON SUBSTRATE MULTICHIP ASSEMBLY

[75] Inventor: Yukun Hsia, Santa Ana, Calif.

[73] Assignee: Northrop Corporation, Hawthorne, Calif.

[21] Appl. No.: 462,668

[22] Filed: Jan. 9, 1990

[51] Int. Cl.⁵ .............................................. H01L 23/48
[52] U.S. Cl. ........................................ 357/71; 357/68; 357/80; 357/81
[58] Field of Search .................. 357/71, 68, 80, 81, 357/88, 57

[56] References Cited

U.S. PATENT DOCUMENTS

| | | | |
|---|---|---|---|
| 3,372,070 | 3/1968 | Zuk | 357/88 |
| 4,446,477 | 6/1984 | Currie et al. | 357/71 |
| 4,516,148 | 6/1985 | Barth | 357/68 |
| 4,646,126 | 2/1987 | Iizuka | 357/71 |
| 4,937,660 | 6/1990 | Dietrich | 357/80 |

Primary Examiner—Eugene R. LaRoche
Assistant Examiner—R. Ratliff
Attorney, Agent, or Firm—Terry J. Anderson; Robert B. Block

[57] ABSTRACT

A multichip electronic package uses a silicon substrate for chip mounting and interconnects, micro-machined inverted and non-inverted truncated vias for intrinsically hermetically sealed I/O connections, and an anodically bonded silicon cover, with support posts. Stacked, colocated and inverted vias are provided for increased chip and interconnect density within an intrinsically sealed, thermally matched package.

21 Claims, 7 Drawing Sheets 5,061,987

SILICON SUBSTRATE MULTICHIP ASSEMBLY

BACKGROUND OF THE INVENTION

1. Field of the Invention

This invention relates to multichip electronic packaging techniques. In particular, this invention relates to packaging techniques which utilize interconnected semiconductor chips on substrates within hermetically sealed packages.

2. Description of the Prior Art

Conventional multichip electronic assemblies provide packaging and integration of semiconductor devices, typically silicon chip integrated circuits (IC's), interconnected on a ceramic substrate in a hermetically sealed enclosure. Although widely used, the heat transfer mismatch between the silicon chips and the ceramic substrates limits chip density and operating life. Such conventional multichip assemblies are often packaged in hermetically sealed ceramic and/or metal cans which result in additional thermal mismatch between the substrate and the package.

Silicon substrates have been used in special purpose electronic packaging techniques such as wafer scale integration. In that technique, each silicon wafer is designed as a special purpose circuit to be packaged as a single unit rather than as a series of identical individual circuits designed to be separated into semiconductor chips and separately packaged during manufacturing. Wafer scale integration (WSI) provides very high packaging densities but is a time consuming and extremely expensive process because it requires new designs for each circuit or circuit change. This is a particular drawback for use with circuits which will not be manufactured in large quantities, such as circuits used for prototyping or other short production run activities. In addition, WSI requires circuit and component redundancy in order to provide for circumvention of defective components during the manufacturing process.

Silicon substrates may be used with chip-to-substrate interconnection techniques such as tape automated bonding, TAB, or flip chips in Which semiconductor chips specially configured with interconnect extensions are mounted or solder bumped and connected on matching portions of a silicon substrate. The use of silicon substrates with flip chips was reported by AT&T Bell Laboratories, at the 1987 IEEE ISSCC conference, to provide improved performance and increased packaging density.

A cost effective, high performance, high density multichip silicon substrate assembly technique, using TAB and/or more conventional interconnect techniques, is not currently available. Conventional approaches have not provided a suitable alternative to hermetic sealed multichip assembly integral with a thermally matched substrate. In addition conventional approaches have not been effective in extending the high density interconnect monolithic silicon technology to the input-output or I/O leads of the packaged assembly.

SUMMARY OF THE INVENTION

The preceding and other shortcomings of the prior art are addressed and overcome by the present invention that provides an hermetically sealed electronic packaging assembly including a silicon substrate, at least one semiconductor chip bonded thereto, and at least one intrinsically hermetically sealed first via for providing electrical connection through the substrate.

In another aspect, the present invention provides a method for packaging electronics in a hermetically sealed assembly by mounting one or more semiconductor chips on a silicon substrate, and forming an intrinsically hermetically sealed first via in the substrate for providing electrical connection for the chip through the substrate.

In another aspect, the present invention provides a multilayer electronic packaging assembly including semiconductor chips mounted on silicon substrates, first vias for providing electrical connection through each substrate for the chips, second vias for providing electrical connection between the substrate and means having thermal properties similar to the substrates for hermetically sealing the chips and substrates in a stack.

In another aspect, the present invention provides a method for forming a multilayer electronic packaging assembly by mounting semiconductor chips on a silicon substrates, forming first vias for providing electrical connection through each substrate for the chip, forming second vias for providing electrical connection between the substrates, and hermetically sealing the chips and substrates in a stack having thermal properties substantially similar to the substrates.

These and other features and advantages of this invention will become further apparent from the detailed description that follows which is accompanied by a set of drawing figures. In the figures and description, numerals indicate the various features of the invention, like numerals referring to like features throughout both the drawings and the description.

DETAILED DESCRIPTION OF THE PREFERRED EMBODIMENT(S)

Figure 1:
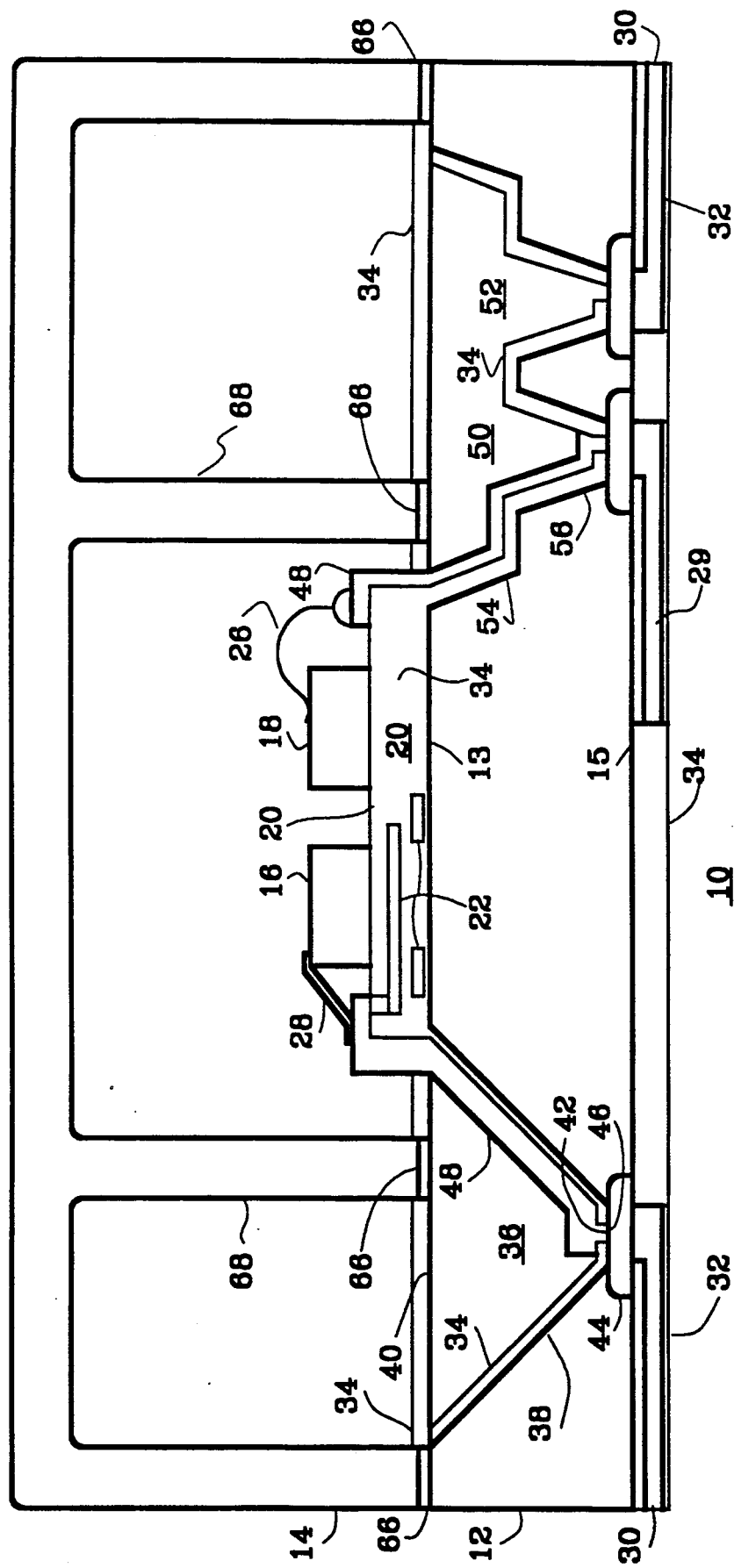
FIG. 1 is a cross sectional view of an illustrative example of a silicon substrate multichip electronic package configured in accordance with the present invention.

FIG. 1 is a cross sectional view of a silicon substrate multichip electronic package 10 according to the present invention, including silicon substrate 12 and silicon cover 14. Silicon substrate 12 is a thin crystal slab of silicon including chip mounting surface 13 and outer surface 15. Mounted on chip mounting surface 13 are a plurality of semiconductor dies and related component devices two of which, chips 16 and 18, are shown for illustration.

Chips 16 and 18 may be mounted directly on chip mounting surface 13 or, for greater interconnection density, on interconnection layer 20 which is used for chip-to-chip interconnection. Interconnection layer 20 may conveniently be a multilayer interconnection substrate configured from a series of conductive paths 22 positioned within an insulating layer such as silicon dioxide isolation layer 34. It is particularly convenient to construct interconnection layer 20 by forming single layer or multilayer conductive paths 22 from deposited aluminum or other metal conductive paths within silicon dioxide isolation layer 34 chip mounting surface 13 using conventional photolithographic processes in order to be completely compatible with the construction materials and techniques used to build chips 16 and 18.

Interconnection layer 20 may be formed as a separate piece of material bonded to silicon substrate 12 on chip mounting surface 13 or as part of chip mounting surface 13 itself. The primary functions of interconnection layer 20 are to provide a bonding surface for mounting chips 16 and 18 and to provide electrical interconnection between them. Depending upon the density of interconnections required by the circuitry being constructed, interconnection layer 20 may be as simple as a series of mounting and single and/or multilayer interconnect paths fabricated on chip mounting surface 13, or as complicated as a series of separate multilayer, multichip subcarriers bonded in predetermined positions across chip mounting surface 13.

Chip-to-chip interconnection and chip-to-substrate interconnection may be also accomplished in any conventional manner, such as flip chips, wire bond 26 or TAB 28, although the TAB technique may be highly preferable for automated manufacturing processes. In addition to the chip-to-chip interconnections and chip-to-substrate interconnections, it is necessary to provide hermetically sealed input/output (I/O) interconnections between circuitry within multichip electronic package 10 and other circuitry outside this package.

Interconnections to the circuitry outside multichip electronic package 10 are accomplished by I/O contacts 30 which may conveniently be copper, gold, goldplated copper or any other material compatible with the environment external to multichip electronic package 10. I/O contacts 30 can be positioned in a series of micro-machined slots or trenches 32 in outer surface 15 of silicon substrate 12. In particular, trenches 32 may be made within a coplanar isolating layer, such as silicon dioxide isolation layer 34, which can be fabricated in place on outer surface 15 by one of many conventional semiconductor processing techniques. The size and depth of trench 32 can be controlled with micro-machining so that the lowest surface of I/O contacts 30 is coplanar with, or slightly within, the outer boundary of outer surface 15 for packaging integrity.

The term "micro-machining" refers to conventional techniques for creating structures in silicon crystals by anisoptropic etching. These techniques are used, for example, for forming "V" shaped grooves as discussed in the article *"Double Ion Implanted V-MOS Technology"*, by Paul Ou-Yang which appeared in the IEEE Journal of Solid State Circuits, Vol. SC-12, No. 1, February 1977 at pages 3 through 10. The recent use of deep trenches in VLSI silicon circuits is also described in the article entitled *"CMOS Device Isolation and Latch-up Prevention"* by Juliana Manilou which appeared in Semiconductor International, page 90 to 92, April 1988. In addition, in the article entitled *"An Electrochemical P-N Junction Etch-Stop for the Formation of Silicon Microstructures"* by T. N. Jackson, M. A. Tischler and K. D. Wise which appeared in IEEE Electron Device Letters, Vol. EDL-2, No. 2, February 1981, pages 44 and 45, the use of electrochemical passivation is offered as an alternate technique for controlling the formation of silicon microstructures without requiring high doping levels.

Returning now to FIG. 1, the remaining connections to be described are the I/O connections between I/O contacts 30 on outer surface 15 of multichip electronic package 10 and the various electrical connections, such as wire bond 26 and/or TAB 28 on chip mounting surface 13, within multichip electronic package 10. It is an important aspect of the present invention that such connections may be made in a convenient manner without breach of the physical integrity of silicon substrate 12.

Figure 2A:
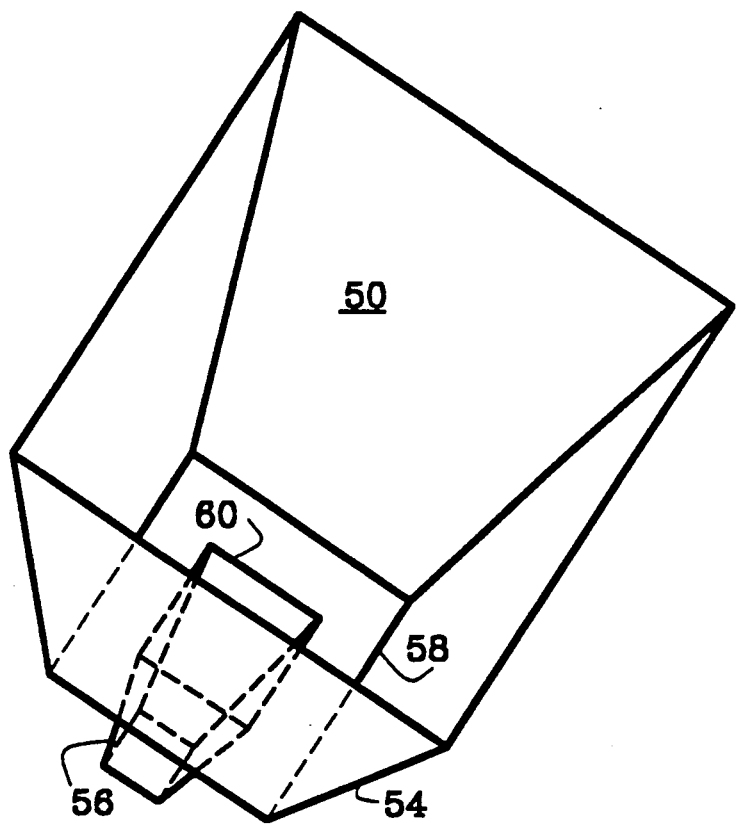
FIGS. 2A and 2B a series of illustrations of the outlines of the various structural shapes associated with the via configuration shown in FIG. 1.

One such I/O connection technique is illustrated by via 36, shown in both FIGS. 1 and 2, which is formed by micro-machining techniques as an inverted and truncated, hollow square pyramid 38 within silicon substrate 12. The outline of inverted and truncated hollow, square pyramid 38 may be seen more clearly in FIG. 2. Larger square surface 40 of pyramid 38 is on chip mounting surface 13 while smaller square surface 42 is formed at the uppermost surface of etch stop region 44. The placement of etch stop region 44, within silicon substrate 12, results in the formation by micro-machining of truncated hollow pyramid 38 rather than a non-truncated hollow pyramid which would penetrate through silicon substrate 12 to outer surface 15.

In order to form an I/O connection, trench 32 is positioned on outer surface 15 to intersect etch stop region 44 so that I/O contact 30 is electrically connected to etch stop region 44. Etch stop region 44 may conveniently be formed by conventional techniques, such as heavily doping a portion of silicon substrate 12, that result in a conducting region of silicon.

The interior surfaces of hollow pyramid 38 are covered with an electrically isolating layer, such as silicon dioxide isolation layer 34, which may conveniently be grown in place during semiconductor processing. Opening 46 is formed within silicon dioxide isolation layer 34 at etch stop region 44 to permit connection by conductive path 48 which may be formed of deposited aluminum or other conducting material compatible with chips 16 and 18 and the associated circuitry and processing techniques used in the interior of multichip electronic package 10.

Conductive path 48 leads to TAB 28 to provide electrical connection to chip 16. It should be apparent from the above description that an intrinsically hermetically sealed I/O between I/O contact 30 and any desired electrical path within multichip electronic package 10 can be made through one or more vias, such as via 36, by using sufficient surface area on chip mounting surface 13 to accommodate larger square surface 40.

Stepped vias 50 and 52 can be employed instead of, or in addition to, via 36 to increase I/O and/or interconnection density. Stepped via 50 is shown in outline form in FIG. 2A for clarity. Stepped via 50 is formed from an axially aligned stack of inverted and truncated hollow square pyramids 54 and 56 joined at one surface. Larger square surface 60 of pyramid 56 is coplanar within and, and significantly smaller than, smaller square surface 58 of pyramid 54.

Figure 2B:
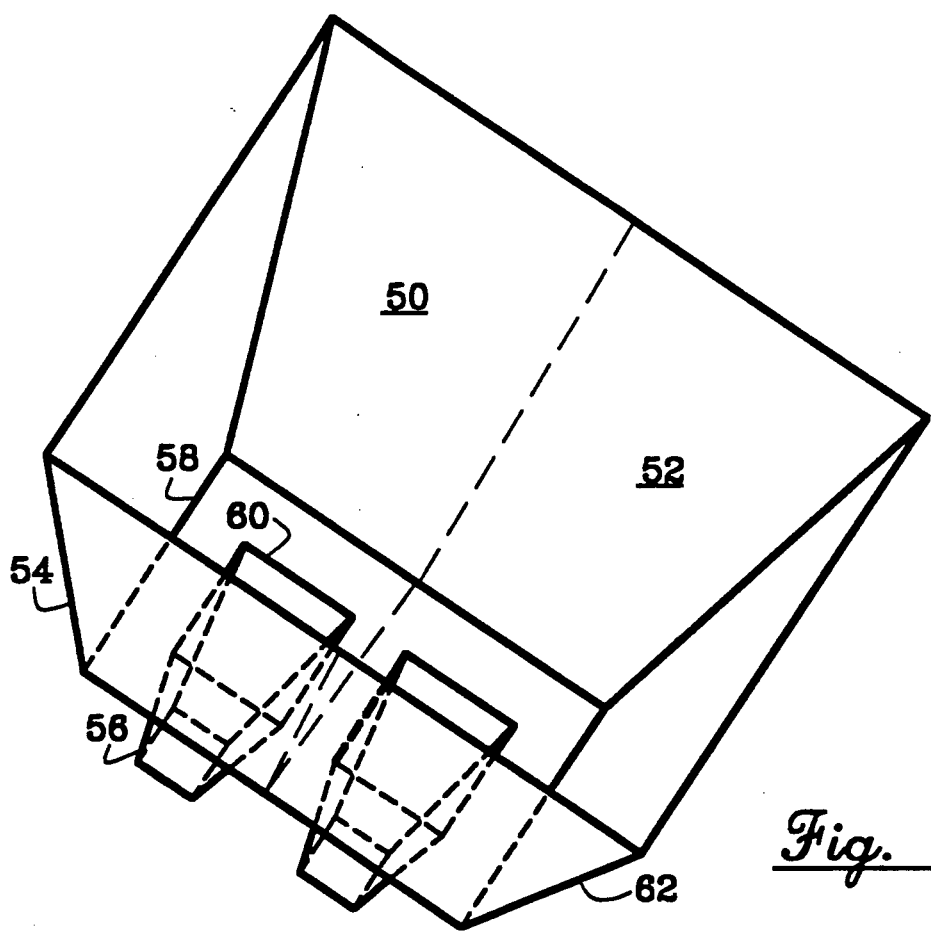

The density improvement is achieved by colocation of stepped vias as illustrated by the colocation of stepped vias 50 and 52 as shown in both FIG. 1 and 2B. Stepped via 52 is formed in the same manner as stepped via 50 except that larger inverted hollow square pyramid 62 of stepped via 52 is colocated with pyramid 54 of stepped via 50 so that the smaller square surfaces of both pyramids are coplanar. That is, smaller square surface 58 of pyramid 54 and larger square surface 60 of pyramid 56 are coplanar with equivalent square surfaces of the equivalent hollow, square pyramids of stepped via 52. Colocation permits the smaller pyramid of each stepped via to retain the same size while substantially reducing the surface area used of chip mounting surface 13 because the surface areas required by each stepped via are made to overlap. Other dimensions remaining the same, the colocation of stepped via 50 with stepped via 52 permits greater density than the structure of via 36.

Returning now to FIG. 1, multichip electronic package 10 includes silicon cover 14 which forms part of the hermetic sealing for the package. The shape of silicon cover 14 must conform to that portion of silicon substrate 12 which must be protected. It may be convenient for silicon substrate 12 to be circular or rectangular and for silicon cover 14 to completely enclose chip mounting surface 13. Silicon cover 14 is shown in FIG. 1 as completely enclosing chip silicon substrate 12 so that the outer edges of silicon substrate 12 and silicon cover 14 match to form a single smooth surface when silicon cover 14 is in position.

Cover 14 is hermetically sealed to silicon substrate 12 by an electrostatic anodic seal, in accordance with known techniques, by means of anodic bonding layer 66 formed around the periphery of silicon substrate 12. Bonding layer 66 must have a bonding temperature and an electrostatic bonding force voltage sufficient to form an irreversible hermetic bond between silicon substrate 12 and silicon cover 14 under acceptable conditions of temperature and pressure. One suitable bonding material for bonding layer 66 is DOW 7740 glass, available from Dow Chemical Company, which requires a 400 degree Centigrade bonding temperature and a 50 volt electrostatic force to form an irreversible bond.

Depending upon the surface area and shape of the portion of chip mounting surface 13 of silicon substrate 12 to be hermetically sealed by the anodic bonding of silicon cover 14, additional structural integrity may be required to support silicon cover 14 above components within multichip electronic package 10. Such structural integrity may be enhanced by one or more support posts 68, concurrently bonded to chip mounting surface 13 of silicon substrate 12 by bonding layers 66. Support post 68 and cover 14 may all conveniently be constructed from a single piece of silicon or any other material suitable for anodic bonding with acceptable structural thermal and electrical characteristics.

Figure 3:
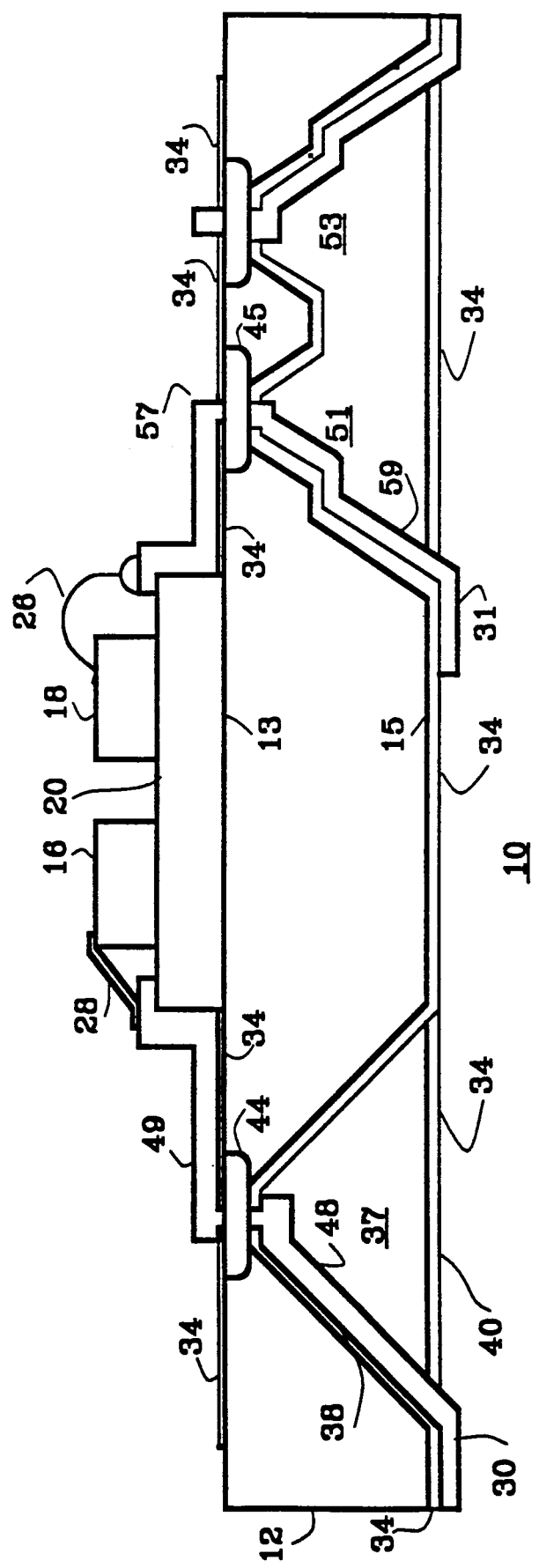
FIG. 3 is a cross sectional view of an illustrative example of a silicon substrate multichip electronic package in accordance with the present invention utilizing intrinsically sealed vias inverted from the shape shown in FIG. 1.

FIG. 3 is a cross sectional view of an illustrative example of a silicon substrate multichip electronic package in accordance with the present invention utilizing intrinsically sealed vias inverted from the shape shown in FIG. 1. As shown in FIG. 1, silicon substrate 12 includes interconnection layer 20, on chip mounting surface 13, upon which are mounted chips 16 and 18. In order to further enhance the chip density available for any given surface area of chip mounting surface 13, via 36 and stepped vias 50 and 52 may be supplemented or replaced by inverted via 37 and inverted stepped vias 51 and 53.

Inverted vias 37, 51 and 53 are constructed in the same manner as the non-inverted vias discussed above with reference to FIGS. 1 and 2, except that etch stop region 44 abuts chip mounting surface 13 rather than outer surface 15. In this manner, with regard to via 37 for example, larger square surface 40 uses surface area of outer surface 15 rather than the often more crowded surface of chip mounting surface 13. Inverted vias therefore, under many circumstances, may permit greater chip and interconnect density than non-inverted vias because inverted vias utilize less surface area of chip mounting surface 13 for the same number of interconnect vias. It may be convenient in some applications to mix inverted and non inverted vias in the same package.

A typical circuit path from I/O to I/O through multichip electronic package 10 through inverted via 37 will now be described with reference to FIG. 3 for convenience. An electrical signal is applied to and/or received from I/O contact 30 of inverted via 37 from a source not shown. Conductive path 48 is the electrical conductor within I/O contact 30 and may be conveniently be configured from gold or copper or any other such material compatible with the environment outside of multichip electronic package 10. The signals are carried by conductive path 48 to etch stop region 44 and then to conductive path 49 within hermetically sealed multichip electronic package 10 without breach of the integrity of silicon substrate 12. This provides intrinsic hermetic sealing because silicon substrate 12 itself is never penetrated.

Conductive path 49 may be constructed in the manner as conductive path 48 but it is usually desirable to construct conductive path 49 from materials which are compatible with the environment within multichip electronic package 10, such as deposited aluminum, refractory metals or silicides. In any event, the electrical signals are conducted by conductive path 49 to interconnection layer 20 and/or chips 16 and 18 by some means such as flip chips, wire bond 26 or TAB 28. The electrical paths within the circuitry represented by interconnection layer 20 and chips 16 and 18, and any other components therein, are arranged in accordance with the application for which multichip electronic package 10 is intended.

Similarly, electrical signals within multichip electronic package 10 may also be connected to another I/O contact 30, labeled for convenience of this description as I/O contact 31, by inverted-stepped vias 51 and/or 53. An electrical signal present at chip 18 may be carried by wire bond 26 to internal conductive path 57, similar to conductive path 49, and from there through etch stop region 45 to non-perimeter I/O contact 31 by conductive path 59 within inverted stepped via 53.

Figure 4:
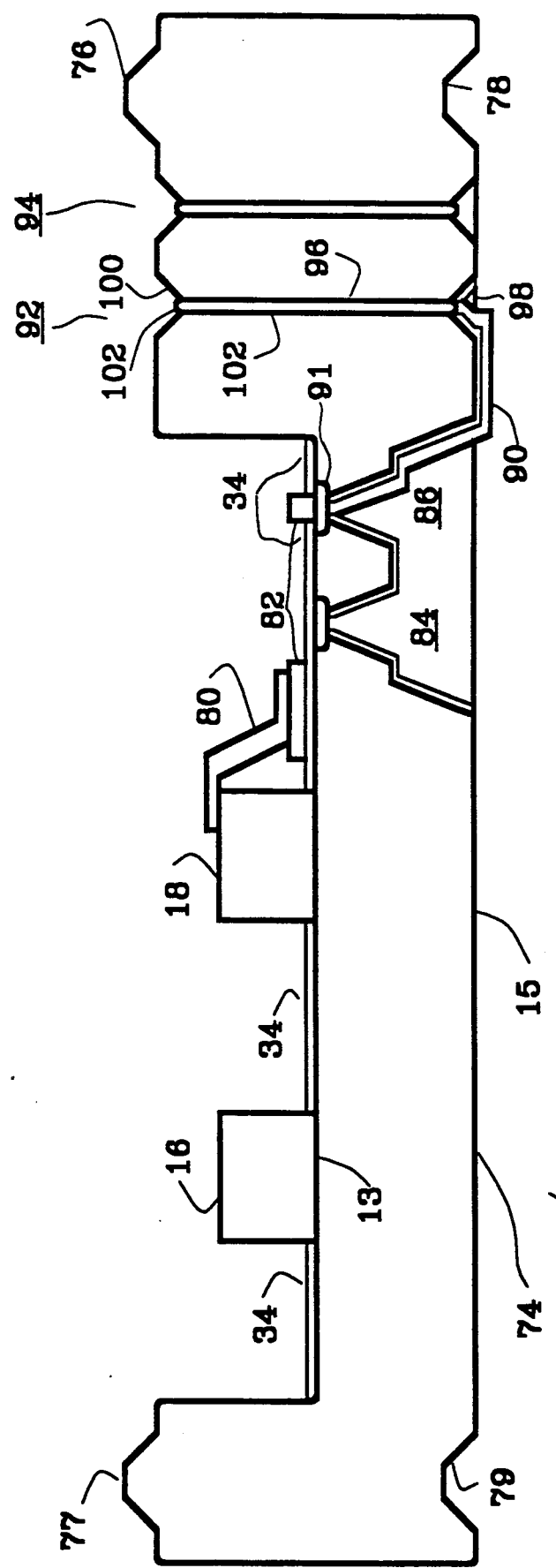
FIG. 4 is a cross sectional view, taken along Line AA of FIG. 5, of the alternate embodiment of the silicon substrate multichip electronic package shown in FIG. 5 suitable for use in a multi-package stack of silicon substrates.

FIG. 4 is a cross sectional view of multichip electronic package 72 according to the present invention suitable for use in a multi-package stack of silicon substrates as discussed in more detail below with reference to FIGS. 5 and 6. Multichip electronic package 72 includes silicon substrate 74 substantially similar to silicon substrate 12 shown in FIG. 1, except as noted below.

Silicon substrate 74 includes chips 16 and 18 mounted directly on chip mounting surface 13, although interconnection layer 20 shown in FIG. 1 could also be used. Chip mounting surface 13 includes support post 68 and interlayer alignment aids 76 and 77 while outer surface 15 of silicon substrate 74 includes matching interlayer alignment aids 78 and 79. The interaction between support post 68 and the various interlayer alignment aids with other packages will be discussed in more detail with respect to FIG. 6.

In the configuration shown in FIG. 4, chip 18 is connected by TAB 80 to conductive path 82. Conductive path 82 connects TAB 80 and therefore chip 18 with inverted stepped via 86. The complete path of conductive path 82 may be seen more clearly in FIG. 5 Inverted stepped via 86 may be constructed in accordance with the arrangement discussed below with regard to inverted stepped vias 51 and 53 shown in FIG. 3. Etch stop region 91 of inverted stepped Via 86 provides an intrinsically hermetically sealed connection between conductive path 82 and interlayer I/O contact 92 through conductive path 90

I/O contacts 92 and 94 are designed to provide I/O connections between chip mounting surface 13 and outer surface 15 rather than to the sidewalls of silicon substrate 74 as does I/O contact 30 for silicon substrate 12 as shown in FIG. 3. I/O contacts 92 and 94 are used as part of an interlayer interconnection bus system to provide electrical interconnection between components such as chips 16 and 18 on multichip electronic package 72 with similar chips on other layers of the multi-package stack shown in greater detail below in FIG. 6.

Interlayer I/O contact 92 is formed from laser drilled hole 96 which extends from micro-machined depression 98 on chip mounting surface 13 to depression 100 on outer surface 15 forming an open channel communicating between the surfaces. This channel is filled with conducting medium 102 to form I/O contact 92. Conducting medium 102 may be plated into drilled hole 96 by conventional processing methods. I/O contact 92 therefore provides selectable electrical connection between chip mounting surface 13 and outer surface 15.

Figure 5:
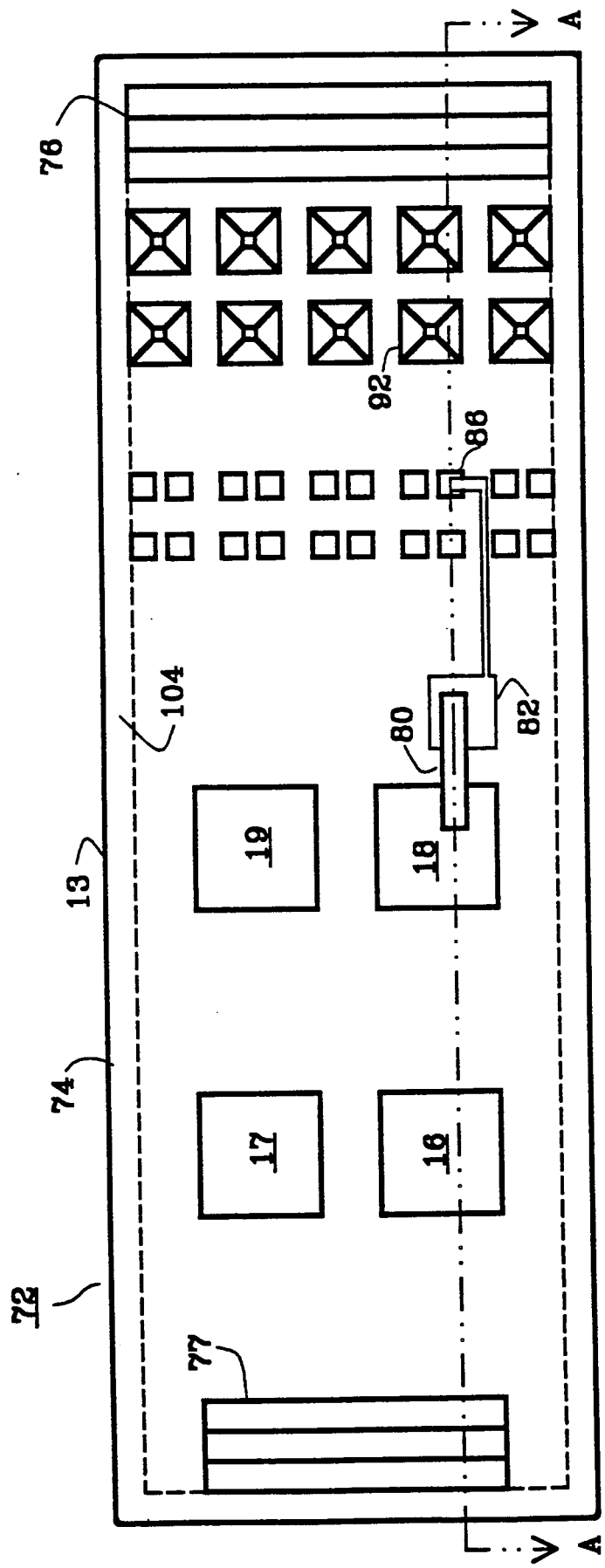
FIG. 5 is a plan view of multichip electronic package 72 shown in FIG.. 4 suitable for use as a layer within a multi-package stack according to the present invention.

FIG. 5 is a plan view of multichip electronic package 72 shown in FIG. 4. FIG. 4 is a cross section of multichip electronic package 72 in FIG. 5 along line AA.

Silicon substrate 74 includes chip mounting surface 13 which is surrounded by anodic sealing surface 104 around the periphery of chip mounting surface 13. As shown in FIG. 1, silicon cover 14 may be attached to chip mounting surface 13 by bonding layer 66. Bonding layer 66 attaches to chip mounting surface 13 along anodic sealing surface 104. Interlayer alignment aids 76 and 77 fit within the perimeter of anodic sealing surface 104. Chips 16 and 18 are mounted on chip mounting surface 13 along with additional chips 17 and 19 positioned around support post 68.

Chip 18 is electrically connected by TAB 80 to inverted stepped via 86 by conductive path 82. As shown on FIG. 4, inverted stepped via 86 is then connected to I/O contact 92 by conductive path 90 along outer surface 15, the underneath surface of multichip electronic package 72, as shown in FIG. 5.

Figure 6:
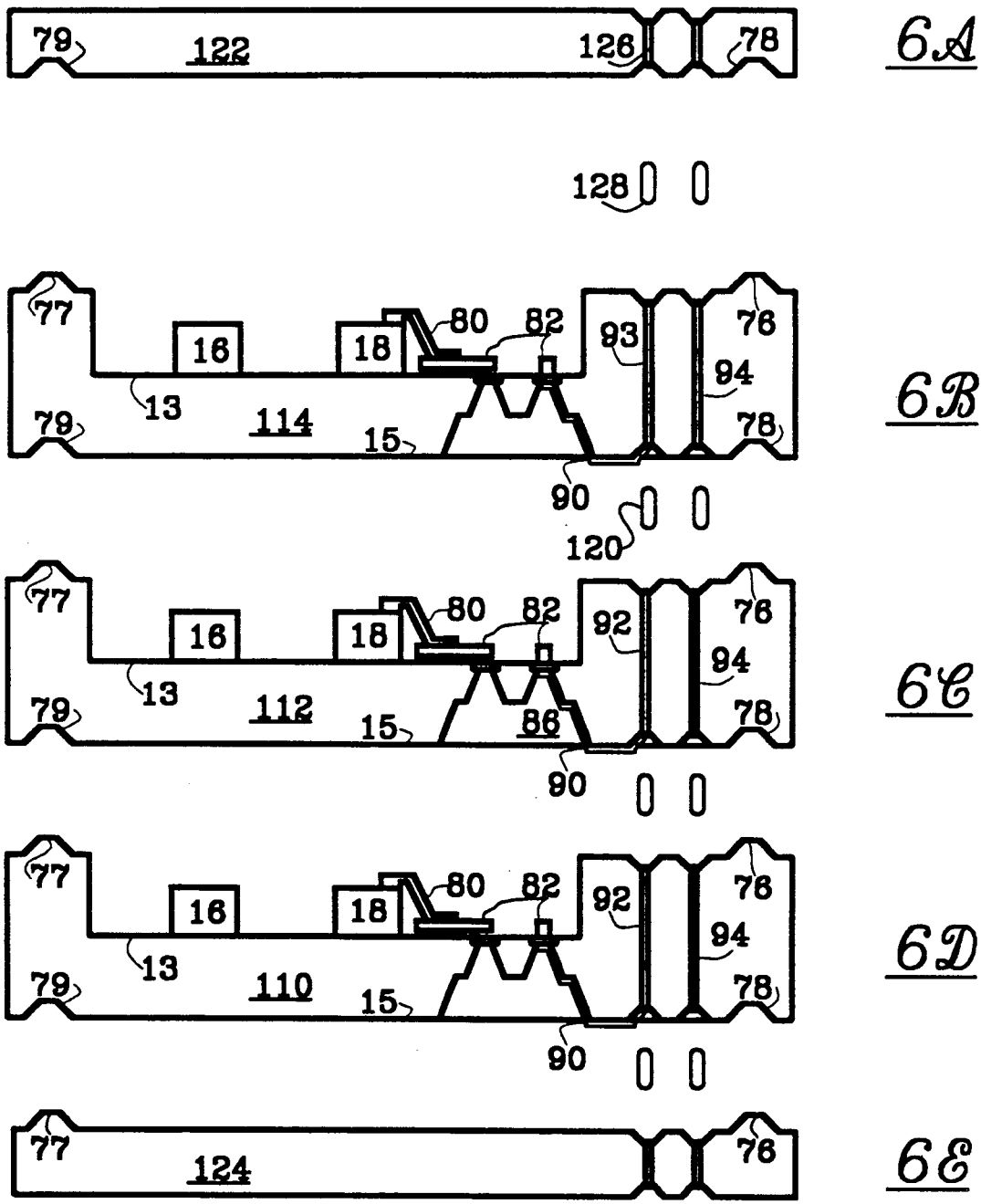
FIG. 6(a-e) is an exploded cross sectional view of a series of multichip packages as shown in FIG. 5 arranged as layers of a multi-package stack, together with top and bottom matching covers, according to the present invention.

FIG. 6 is an exploded cross sectional view of a series of multichip electronic packages 72 as shown in FIG. 5 arranged as three internal layers 110, 112 and 114 of multi-package stack 116 according to the present invention. Internal layer 112 is shown as an example in detail in FIG. 6C and is identical to multichip electronic package 72 as shown in FIG. 4. Internal layers 110 and 114 may be identical, similar or unrelated in internal electronic configuration to internal layer 112.

As shown in FIG. 5, internal interconnections between electronic components within internal layer 110, such as chips 16 and 18, are made on chip mounting surface 13. Interconnections from such components to components on other layers and/or to I/O connections are made by vias such as inverted stepped via 86. All such I/O connections are connected by conductive paths, such as conductive path 90, to interlayer I/O contacts such as I/O contact 92. I/O contact 92 serves part of a bus system to interconnect layers and to provide connections to I/O outside of multi-package stack 116.

Interconnection between I/O contact 92 of internal layer 112 shown in FIG. 6C and I/O contact 93 of internal layer 114 shown in FIG. 6B is accomplished by deformation of deformable contact 120, between the micro-machined depressions, such as depression 100, formed in the ends of I/O contacts 92 and 93, when the layers are stacked and fastened together. Deformable contact 120 may be a bead or sphere of a malleable, electrically conducting material. The contact provides the nodal point of continuity between the separate wafer layers.

In addition to interconnection between layers 110, 112 and 114, I/O connections are made to top and bottom stack covers 122 and 124 by additional deformable contacts similar to deformable contact 120. For example, connection between I/O contact 93 of internal layer 114 shown in FIG. 6B and I/O contact 126 of top stack cover 122 is accomplished by deformable contact 128 when the layers are stacked together.

Top and bottom stack covers 122 and 124 serve as both mechanical and hermetic protection for multi-package stack 116 and provide electrical interconnections between multi-package stack 116 and other electronic equipment and power supplies, not shown. Top and bottom stack covers 122 and 124 may be identical, similar or electrically different, depending upon the application for multi-package stack 116 Top stack cover 122 is shown in greater detail in plan view in FIG. 7.

The operation of interlayer alignment aids 76, 77, 78 and 79 to align layers in multi-package stack 116 will be discussed With particular reference to FIGS. 6B, C and D. Male interlayer alignment aids 76 and 77 of internal layer 110 mate with interlayer alignment aids 78 and 79 of internal layer 112. Similarly, male interlayer alignment aids 76 and 77 of internal layer 112 mate with interlayer alignment aids 78 and 79 of internal layer 114. Interlayer alignment aids are used in a similar manner between the aligned layers and top stack cover 122 and bottom stack cover 124.

Figure 7:
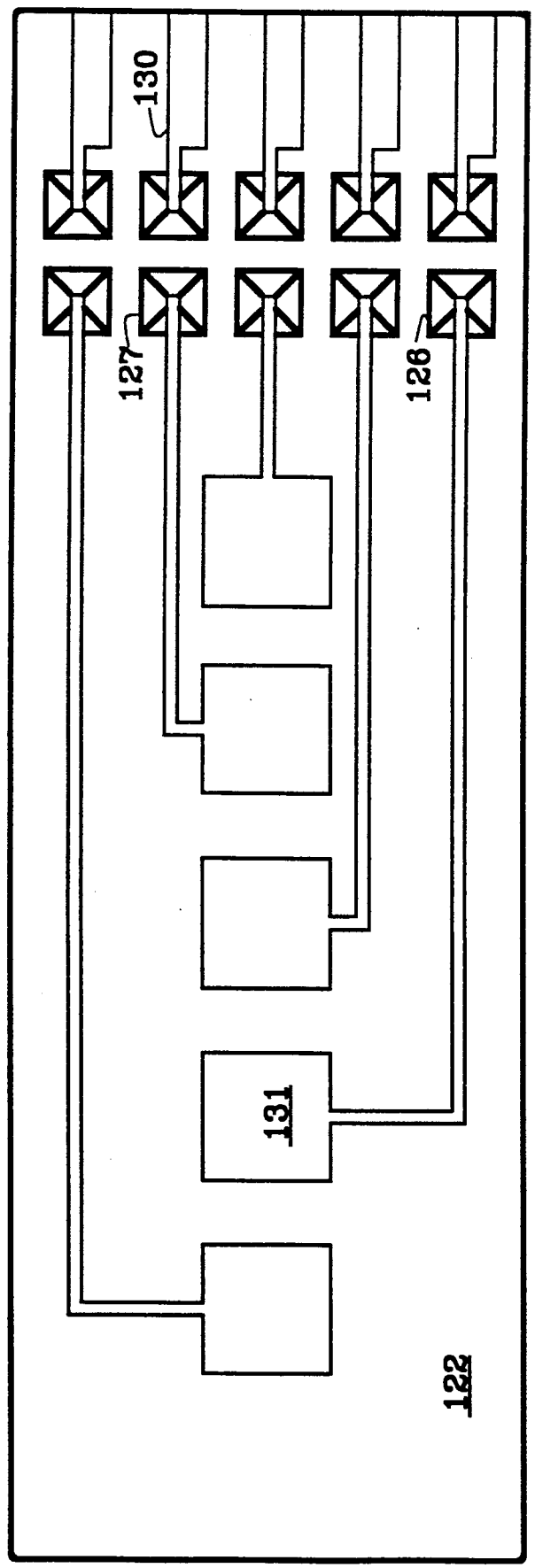
FIG. 7 is a plan view of top stack cover 122 of the multi-package stack as shown in FIG. 6A.

Referring now to FIG. 7, top stack cover 122 includes a number of I/O contacts such as I/O contacts 126 and 127. These I/O contacts provide electrical interconnection between multi-package stack 116 and external electronics, not shown, by means of conducting paths such as peripheral contact 130 and non-peripheral contact pad 131. I/O contacts 130 and 131 may conveniently be constructed from materials compatible with the environment outside of multi-package stack 116, such as gold, copper or gold-plated copper, electro-deposited on a layer of field oxide grown on the surface of top stack cover 122.

Multi-package stack 116 therefore provides a cost effective high density multilayer, multichip silicon substrate package, compatible with TAB and/or more conventional interconnect techniques, suitable for advanced high performance electronic systems applications.

Referring now again to FIG. 1, individual semiconductor chips, such as chips 16 and 18, may be interconnected within a single layer hermetically sealed silicon package by conventional techniques, such as wire bond 26, and especially by automated assembly techniques such as TAB 28. These chips may be bonded and interconnected directly to the surface of a silicon substrate, such as chip mounting surface 13 of silicon substrate 12, or through a multilayer interconnection device such as interconnection layer 20. Appropriate electrical interconnections within a particular substrate may be brought out for I/O connections by conducting paths compatible with the internal environment, such as conductive path 48, through several different types of intrinsically hermetically sealed vias, such as vias 37, 50, 52 (and/or inverted vias 37, 51 and 53 shown in FIG. 3 to I/O contacts compatible with the external environment, such as I/O contact 30 protected within grooves on the outside surface of the substrate, such as trench 32. This single layer package may be hermetically sealed by anodic bonding with a cover having similar heat transfer characteristics, such as silicon cover 14, supported if necessary by anodically bonded internal support posts such as support post 68.

Referring now to FIG. 6, several silicon substrates, such as internal layers 110, 112 and 114 may be stacked together to form a multi-package stack, such as stack 116. Appropriate electrical interconnections within a particular substrate, such as internal layer 112, may be brought out for I/O connections by conducting paths such as conductive path 82 to several different types of intrinsically hermetically sealed vias, such as inverted stepped via 86. Electrical connections from the vias are brought out by conducting paths, such as conductive path 90, for interlayer interconnection by a series of interlayer I/O contacts, such as interlayer I/O contact 92. Interlayer I/O connections are made by deforming deformable contacts, such as deformable contact 120, between layers and between the layers and top and bottom stack covers, such as top stack cover 122 and bottom stack cover 124.

Individual silicon substrate packages and multi-package stacks configured according to the prevent invention provide intrinsically hermetically sealed vias in an all silicon package as an alternative to the glass to metal seals used for conventional hermetic sealing of a substrate within a thermally mismatched packaging container.

While this invention has been described with reference to its presently preferred embodiment(s), its scope is not limited thereto. Rather, such scope is only limited insofar as defined by the following set of claims and all equivalents thereof.

What is claimed is:

1. An electronic packaging assembly, comprising:
   a silicon substrate having first and second sides;
   at least one semiconductor chip mounted on one of said sides;
   dopant means disposed into said substrate to form a doped conducting via region through said substrate from one side to the other without perforation of said substrate so as to maintain the mechanical and hermetic integrity of the structure of said substrate;
   a first conductor connected to said doped region at said first side;
   a second conductor connected with the doped region from said second side;
   said first conductor, doped region, and second conductor forming an electrically conductive via extending through said substrate from the first side to the second side without breaching the intrinsic hermetic integrity of said substrate;
   at least one of said conductors being connected to said chip; and
   a silicon cover hermetically sealed to said substrate, said cover and substrate thereby forming a fully hermetically sealed packaging assembly having the same coefficient of thermal expansion throughout.

2. The electronic packaging assembly claimed in claim 1, wherein said first and second sides of said silicon substrate define first and second surfaces, respectively, and wherein the electrical connection means further comprises:
   a hollow structure in the substrate leading to the doped region in the substrate, between the second surface and the conducting region; and
   a conductor passing through the hollow structure for interconnecting the second surface to said doped region.

3. The electronic packaging assembly claimed in claim 2, wherein the chip is mounted on the first surface of the substrate.

4. The electronic packaging assembly claimed in claim 2, wherein the chip is mounted on the second surface of the substrate.

5. The electronic packaging assembly claimed in claim 2, wherein the conductor is formed of material compatible with the environment between the chip and substrate.

6. The electronic packaging assembly claimed in claim 2, wherein the hollow structure comprises:
   a truncated hollow pyramid.

7. The electronic packaging assembly claimed in claim 6, wherein the hollow structure is a truncated hollow square pyramid formed by micro-machining.

8. The electronic packaging assembly claimed in claim 2, wherein the hollow structure comprises:
   axially aligned truncated hollow pyramids separated by a hollow column.

9. The electronic packaging assembly claimed in claim 8, further comprising:
   a second via including a hollow structure partially overlapping a portion of the hollow structure of the first via.

10. The electronic packaging assembly claimed in claim 1, further comprising:
    means for anodically bonding said cover means to the substrate.

11. The electronic packaging assembly claimed in claim 1, further comprising:
    a plurality of semiconductor chips; and
    multilayer substrate means bonded between the chips and substrate for mounting and interconnecting the chips.

12. An electronic packaging assembly, as in claim 1 further in which said dopant means comprises:
    a heavily doped region diffused into one of the surfaces of said substrate for forming a conductive region in said substrate,
    a channel formed partially through the substrate from the other of said surfaces and opposite from said doped region, said channel extending through said substrate and to said region, a first conductor in ohmic contact with said doped region and extending from said region and along said channel, and a second conductor formed on the other surface from said channel and in ohmic contact with the doped region, said first conductor, doped region, and second conductor forming an electrically conductive via extending through said substrate without breaching the intrinsic integrity of said substrate, at least one of said conductors being connected to said chip.

13. The electronic packaging assembly claimed in claim 11 further comprising:

a plurality of silicon support posts placed between the cover and the support plate to additionally support the cover, means for anodically bonding said posts to said cover and said substrate.

14. An electronic packaging assembly, including a plurality of substrate each comprising:

a silicon substrate having first and second sides, at least one semiconductor chip mounted on one of said sides, dopant means disposed into said substrate to form a doped conducting via region through said substrate from one side to the other without perforation of said substrate so as to maintain the mechanical and hermetic integrity of the structure of said substrate, a first conductor connected to said doped region at said first side, a second conductor connected with the doped region from said second side, said first conductor, doped region, and second conductor forming an electrically conductive via extending through said substrate from the first side to the second side without breaching the intrinsic hermetic integrity of said substrate, at least one of said conductors being connected to said chip;

means for stacking said substrates one on top of the other;

second vias for electrically interconnecting the conductors on said substrates;

a silicon cover hermetically sealed to the top substrate, said cover and bottom substrate thereby forming a fully hermetically sealed packaging assembly having the same coefficient of thermal expansion throughout.

15. The electronic packaging assembly claimed in claim 14, wherein said first and second sides define first and second surfaces, respectively, and wherein the first vias further comprise:

electrically conducting regions in each substrate adjacent first surfaces thereof;

interconnect means associated with each substrate for providing electrical connections between the regions and a second surface thereof; and conductive means for providing electrical connection between conductive regions and second vias.

16. The electronic packaging assembly claimed in claim 15, wherein the interconnecting means comprises:

hollow structures in each substrate between the second surface and the conducting regions; and conductors interconnecting the conducting regions to the second surface through the hollow structures.

17. The electronic packaging assembly claimed in claim 14, wherein the sealing means comprises:

top and bottom covers anodically bonded to surfaces of adjacent substrates; and means for anodically bonding each remaining substrate surface to an adjacent substrate.

18. The electronic packaging assembly claimed in claim 14 wherein the sealing means further comprises:

deformable contacts for electrically interconnecting second vias in adjacent substrates.

19. The electronic packaging assembly claimed in claim 18 wherein the sealing means further comprises:

anodically bonded top and bottom covers;

second vias associated with each cover;

deformable contact means for electrically connected the second vias associated with each cover to second vias in adjacent substrates; and electrical input output means associated with each cover for providing electrical connection to the second vias therein.

20. The electronic packaging assembly claimed in claim 14 wherein the second vias further comprise:

holes drilled through the substrate;

conductive materials substantially filling each hole; and depressions in the substrate surfaces associated with each end of a via hole therein.

21. The electronic packaging assembly claimed in claim 20 further comprising:

deformable contact means associated with depressions on adjacent substrate surfaces for providing electrical interconnection there between.

* * * * *